(12) United States Patent
Mertins et al.

(10) Patent No.: US 7,426,454 B2
(45) Date of Patent: Sep. 16, 2008

(54) METHOD AND SYSTEM FOR DETERMINING A LOCATION OF A WIND-POWERED ELECTRICAL ENERGY FACILITY

(75) Inventors: Karl-Heinz Otto Mertins, Davenport, IA (US); William Francis Fulkerson, Bettendorf, IA (US); Jerry Ray Halterman, Fort Collins, CO (US); George Bailey Muehlbach, Fort Collins, CO (US); Deepak Jugatram Joshi, Davenport, IA (US)

(73) Assignee: Deere & Company, Moline, IL (US)

( * ) Notice: Subject to any disclaimer, the term of this patent is extended or adjusted under 35 U.S.C. 154(b) by 613 days.

(21) Appl. No.: 10/972,467

(22) Filed: Oct. 25, 2004

(65) Prior Publication Data

US 2005/0192779 A1   Sep. 1, 2005

Related U.S. Application Data

(60) Provisional application No. 60/548,298, filed on Feb. 27, 2004.

(51) Int. Cl.
*G06F 17/50* (2006.01)
(52) U.S. Cl. .................................. 703/1; 703/2; 700/291
(58) Field of Classification Search .................... 703/1, 703/6, 2; 700/291, 286, 295; 705/1, 10; 290/44
See application file for complete search history.

(56) References Cited

U.S. PATENT DOCUMENTS 6,512,966 B2   1/2003   Lof et al.

(Continued)

FOREIGN PATENT DOCUMENTS

JP   11093824 A   4/1999

(Continued)

OTHER PUBLICATIONS

Alvarez-Farizo et al., B. Using conjoint analysis to quantify public preferences over the enrivonmental impacts of wind farms. An example from Spain, Energy Policy, vol. 30, Jan. 2002, pp. 107-116.*

(Continued)

*Primary Examiner*—Russell Frejd

(57) ABSTRACT

A method for determining a location of a conversion device for converting wind energy into electrical energy comprises establishing a plurality of data layers, including at least a wind data layer and a transmission grid data layer. Each data layer contains attribute data that is associated with corresponding location data. The location data of one layer is aligned with the location data of other layers to form a composite layer. The composite layer is searched to identify the first compliant location data associated with a target value or a target value range of the attribute data for the wind data layer. The composite layer is searched to identify a second compliant location data associated with a target value or a target value range of the attribute data for the transmission grid data. The composite layer is searched to identify a third compliant location data associated with a target value or target value range of the attribute data for an additional data layer other than the wind data layer and the transmission grid data layer. The intersection of the first compliant location data, the second compliant location data, and the third compliant data is determined. The intersection is identified as one or more preferential regions for locating an energy conversion device.

22 Claims, 17 Drawing Sheets (8 of 17 Drawing Sheet(s) Filed in Color)

U.S. PATENT DOCUMENTS

| | | | |
|---|---|---|---|
| 6,696,766 | B1 | 2/2004 | Mamo |
| 6,850,821 | B2* | 2/2005 | Weitkamp .................. 700/286 |
| 6,882,904 | B1* | 4/2005 | Petrie et al. ................ 700/295 |
| 2002/0000723 | A1* | 1/2002 | Weitkamp ..................... 290/44 |
| 2002/0087234 | A1* | 7/2002 | Lof et al. .................... 700/286 |
| 2003/0127862 | A1* | 7/2003 | Weitkamp ..................... 290/44 |
| 2003/0149584 | A1 | 8/2003 | Wobben ......................... 705/1 |
| 2005/0192780 | A1 | 9/2005 | Mertins et al. |
| 2005/0192827 | A1 | 9/2005 | Mertins et al. |
| 2005/0192859 | A1 | 9/2005 | Mertins et al. |
| 2005/0203671 | A1 | 9/2005 | Mertins et al. |

FOREIGN PATENT DOCUMENTS

WO     WO 01/86145 A1     11/2001

OTHER PUBLICATIONS

Kose et al., R. The analysis of wind data and wind energy potential in Kutahya, Turkey, Renewable and Sustainable Energy Reviews, vol. 8, Jun. 2004, pp. 277-289.*

Kose, R. An evaluation of wind energy potential as a power generation source in Kutahya, Turkey, Energy Conversion and Management, vol. 45, Jul. 2004, pp. 1631-1641.*

Ozturk et al., U.A. Heuristic methods for wind energy conversion system positioning, Electric Power Systems Research, vol. 70, Aug. 2004, pp. 179-185.*

Durak et al., M. Wind power potential in Turkey and Akhisar case study, Renewable Energy, vol. 25, Mar. 2002, pp. 463-472.*

Cockerill et al., T.T. Combined technical and economic evaluation of the Northern European offshore wind resource, Journal of Wind Engineering and Industrial Aerodynamics, vol. 89, Jun. 2001, pp. 689-711.*

Welfonder et al., E. Development and experimental identification of dynamic models for wind turbines, Control Engineering Practice, vol. 5, Jan. 1997, pp. 63-73.*

Giebel, G. Equalizing Effects of the Wind Energy Production in Northern Europe Determined from Reanalysis Data. Riso National Laboratory. Roskilde. May 2000, Riso-R-1182(EN), pp. 1-20.

Spatial Planning for WTGs Using the WindPRO software Using the New WindPLAN module—case study: Municipality of Nibe [online], [retrieved Oct. 25, 2004]. Retrieved from the internet <URL: www.emd.dk/files/windpro/updates/NEWS-2002/EWEA__Wind PLAN__120603.pdf, pgs. unavailable.

Applying New Computer-Aided Tools for Wind farm Planning and Environment Impact Analysis [online], [retrieved Oct. 25, 2004]. Retrieved from the Internet <URL: www.emd.dk/files/windpro/updates/NEWS-2002/EWEA__WindPLAN__Paper.pdf, pp. 1-5.

Turksoy, F. Investigation of Wind Power Potential at Bozcaada, Turkey, *Renewable Energy*, vol. 6, No. 8, pp. 917-923, 1995.

Tsuchiya, K.; Matsuzaka, T. Evaluation of Estimation Methods for Annul Energy Obtained by Wind Turbines in a Wind Park, *Transactions of the Japan Society of Mechanical Engineers*, vol. 61, No. 590, pp. 3735-3740 (English Abstract included on p. 3735), 1995.

Romeo, R.; Magri, S. Wind Energy Evaluation for Breakwater Plants, *Wind Engineering*, vol. 18, No. 4, pp. 199-206, 1994.

Gupta R.P.; Rao, K.S. Prediction Of Wind Power Potential Using Wind Atlas Analysis and Application Programme, *Bhel Journal*, vol. 18, No. 1, pp. 29-39, Date unknown.

Uyar, T.S.; Alpay, M.N.; Yazar, A. *Turkish Wind Atlas Studies for Bodrum, Mugla*, European Wind Energy Conference, pp. 906-910, 1989.

Karlis, A.D.; Dermentzoglou, J.CH.; Papadopoulos, D.P. Wind Energy Surveying and Technoeconomic Assessment of Identifiable WEC System Installations, *Energy Conversion and Management* vol. 42, No. 1, pp. 49-67, 2000.

* cited by examiner

Wind Power Project
*National Power Transmission Grid (kv)*
/\/ 115  /\/ 138  /\/ 161  /\/ 230  /\/ 345  /\/ 500

Preferential Region A

Fig. 15

METHOD AND SYSTEM FOR DETERMINING A LOCATION OF A WIND-POWERED ELECTRICAL ENERGY FACILITY

This document claims priority based on U.S. provisional application Ser. No. 60/548,298, filed Feb. 27, 2004, and entitled METHOD AND SYSTEM OF ESTABLISHING A WIND-POWERED ELECTRICAL GENERATION FACILITY, under 35 U.S.C. 119(e).

FIELD OF THE INVENTION

This invention relates to a method and system for determining a location of a wind-powered electrical energy facility.

BACKGROUND OF THE INVENTION

In the prior art, certain engineering models have been used to establish technical viability in planning the location of wind turbines or wind farms. The engineering models may consider the topography of a region, the wind regime of the region, and the technical specifications of various commercially available wind turbines. However, the engineering models provide only a partial view of reality because other critical financial, geostatistical, and other information may influence the economic viability of a wind farm. Thus, a need exists for an accurate model to plan an economically viable location of a wind turbine or a wind farm.

SUMMARY OF THE INVENTION

A method for determining a location of a conversion device for converting wind energy into electrical energy comprises establishing a plurality of data layers, including at least a wind data layer and a transmission grid data layer. Each data layer contains attribute data that is associated with corresponding location data. The location data of one layer is aligned with the location data of other layers to form a composite layer. The composite layer is searched to identify the first compliant location data associated with a target value or a target value range of the attribute data for the wind data layer. The composite layer is searched to identify a second compliant location data associated with a target value or a target value range of the attribute data for the transmission grid data. The composite layer is searched to identify a third compliant location data associated with a target value or target value range of the attribute data for an additional data layer other than the wind data layer and the transmission grid data layer. The intersection of the first compliant location data, the second compliant location data, and the third compliant data is determined. The intersection is identified as one or more preferential regions for locating an energy conversion device.

The file of this patent contains at least one drawing executed in color. Copies of this patent with color drawing(s) will be provided by the Patent and Trademark Office upon request and payment of the necessary fee.

BRIEF DESCRIPTION OF THE DRAWINGS

FIG. 15 represents a financial data analysis associated with the candidate region.

DESCRIPTION OF THE PREFERRED EMBODIMENT

As used herein, the terms "transmission" and "distribution", and variations thereof, do not refer to and are not limited to any particular voltage range or ranges. The terms transmission and distribution shall be accorded their ordinary dictionary definitions when used as nouns or adjectives. Notwithstanding the foregoing, to clarify the definitions commonly used in utility industry within the United States, "transmission voltage range" refers to above approximately 161 kilovolts; "sub-transmission voltage range" refers to approximately 55 kilovolts to 138 kilovolts; and "distribution voltage range" refers to approximately 33 kilovolts and below.

Figure 1:
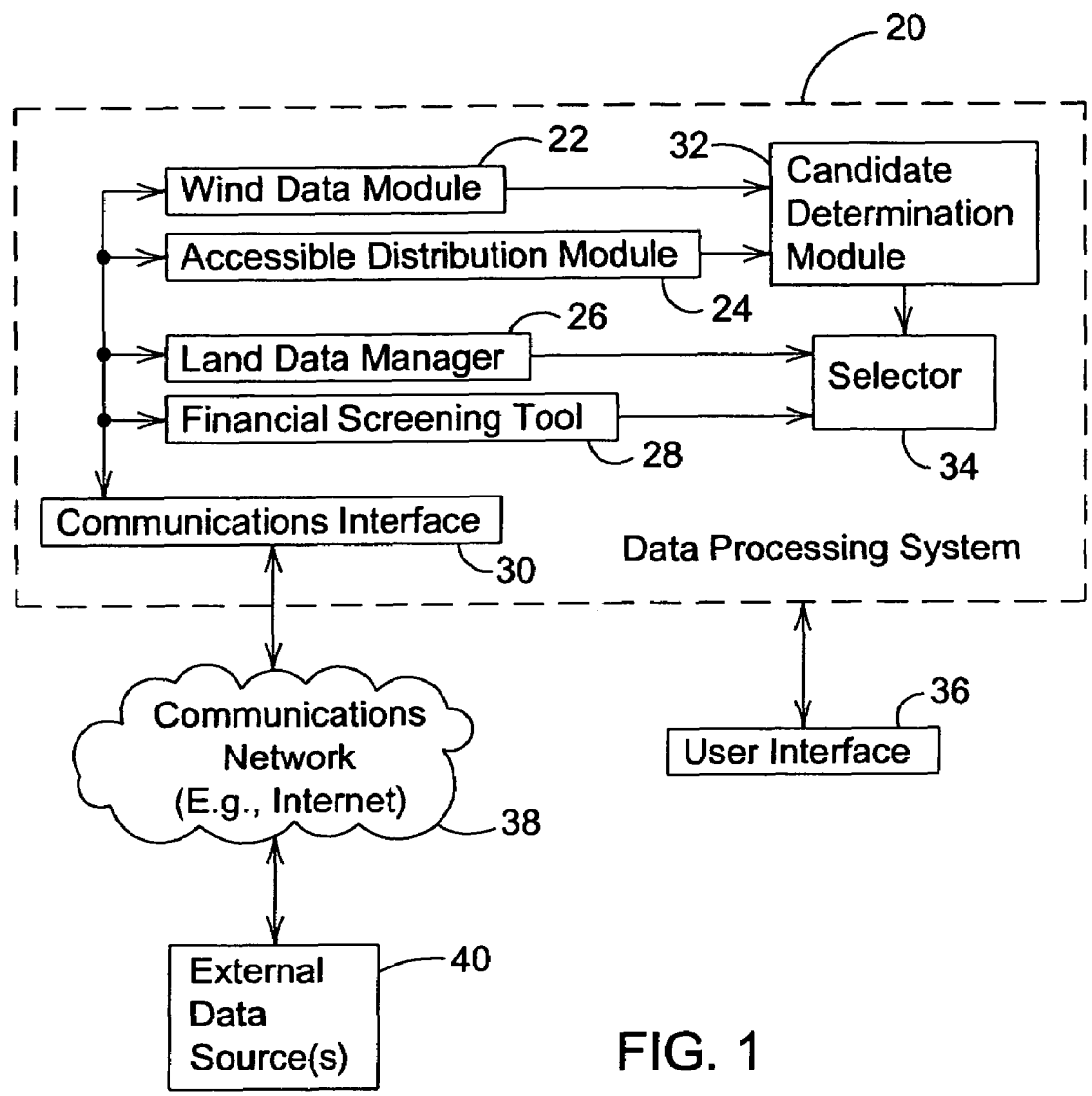
FIG. 1 is a block diagram for a system for establishing a wind-powered electrical generation facility in accordance with the invention.

FIG. 1 is a block diagram of a system for establishing a wind-powered generation facility. The data processing system 20 is associated with a user interface 36 for accepting input data from a user and for providing output data to a user. The data processing system 20 may communicate via a communications network 38 (e.g., Internet) or another communications link to one or more external data sources 40. However, the data processing system 20 may rely on a user to input or enter input data via the user interface 36, as opposed to obtaining the input data via communication between the data processing system 20 and one or more external data sources 40.

The data processing system 20 may comprise a wind data module 22, an accessible distribution module 24 that communicates to a candidate determination module 32. In turn, the candidate determination module 32 communicates to a selector 34. A land data manager 26 and a financial screening tool 28 provide input data to the selector 34. A communications interface 30 supports communications between the data processing system 20 and an external data source 40 via the communications network 38 or a communications link. In one embodiment, the communications network 38 may communicate with one or more of the following: a wind data module 22, accessible distribution module 24, land data manager 26, and financial screening tool 28.

The user interface 36 may comprise one or more of the following: a graphical user interface, a keypad, a keyboard, a display, a pointing device (e.g., a mouse), an optical reading device, a magnetic reading device, an optical disk drive, a magnetic disk drive, and a magnetic tape device.

The external data source 40 may comprise any of the following: a credit bureau that has financial records on individuals and/or businesses, a topographic data source, a wind regime data source, a meteorological data source (e.g., a data feed), a governmental report data source, demographic data source, census data source, a geospatial data source, or other data sources or databases that are commercially available, available through government or governmental agencies, or otherwise accessible.

The wind data module 22 may manage the storage and retrieval of wind data. Wind data may be expressed as one or more of the following: a wind velocity, a wind speed, a wind direction, a wind azimuth, a prevalence, a temporal component, a measurement interval, a measurement altitude or measurement height above ground level, a measurement location or measurement coordinates, a reading or sampling interval, a reliability level, a percentage of reliability, and a wind class. A wind velocity has two components: a wind speed and a wind azimuth. The wind azimuth may be expressed as a compass direction, degrees from a reference direction (e.g., North), or otherwise. Wind velocity is associated with respective measurement location data (e.g., geographic coordinates). The temporal component may represent a measurement interval or reading interval for the wind velocity. For example, a database may contain wind velocity data measured or recorded at a sampling interval (e.g., every 15 minutes or hourly) at known geographic coordinates and corresponding heights above ground level or sea level. The average wind velocity may represent an average velocity over some time duration. Reliability of the wind (e.g., or average wind velocity or wind speed) may be expressed as a percentage of time in which (or probability at which) the wind velocity meets or exceeds some minimum threshold or is bounded by some range.

In one embodiment, the wind data may be expressed in accordance with a model which models wind data as the following components: (1) one of N angular compass directions at regularly spaced angular intervals, (2) a corresponding average wind speed for each of the N angular compass directions, where N is equal to a positive integer greater than one; (3) a time interval (e.g., monthly or weekly) associated with each of the wind speeds (e.g., average wind speeds); (4) a height of measurement or observation (e.g., height above mean sea level) of the corresponding wind speeds (e.g., average wind speed); and (5) corresponding geographic coordinates for the measurement or observation. The above components of the wind data may populate a database, a table, a multidimensional matrix or series of matrices, for example. In another embodiment, the wind data may be derived from or based on National Weather Service data (in the U.S.) or other publicly or commercially available data and local data measurements (e.g., wind meter readings) in a defined region (inclusive of the candidate region) over approximately a one year time frame or greater.

Accessible distribution data may comprise one or more of the following: transmission line data, transmission line path data, transmission line capacity data, distribution infrastructure data, network data, power supply data, power plant data, power plant capacity data, power load data, power grid data, including forecasted demand data, and location data (e.g., geographic coordinates) or temporal periods associated with any of the foregoing items. Transmission line data or distribution infrastructure data comprises any of the following: transmission towers, power plant sites, power stations, power sub-stations, transmission capacity, available transmission capacity, used transmission capacity, historical electrical energy consumption, planned electrical energy consumption, number of transmission lines, physical size (e.g., length and cross-sectional diameter, conductor type, or wire gauge) of transmission lines, specifications of transmissions lines, regional and national power generation, specifications of off-line power plants, and specifications of on-line power plants.

Land data may comprise any of the following: metes and bounds of real property, governmental geographic survey data, land use data, agricultural land boundaries, land owner data, land holder data of any interest in corresponding real property, satellite image data of land, aerial image data of land, public records, real property public records, grantee-grantor indices associated with various counties, census data, foreclosure notices and publicly available court filings related to real property, marketing data, demographic data, customer names and corresponding addresses, and plat data. The metes and bounds or boundaries of real property may be defined by geographic coordinates or location data. Other land data may be referenced to or associated with the location data (e.g., geographic coordinates).

Financial data may comprise any of the following: a credit analysis of a corresponding land owner or land holder, a credit rating of a corresponding land owner or land holder, a loan application, publicly available business records, secretary of state business filings, real property mortgage records, and real property foreclosure records, census data, demographic data, annual income data, and bankruptcy filings and notices.

Figure 2:
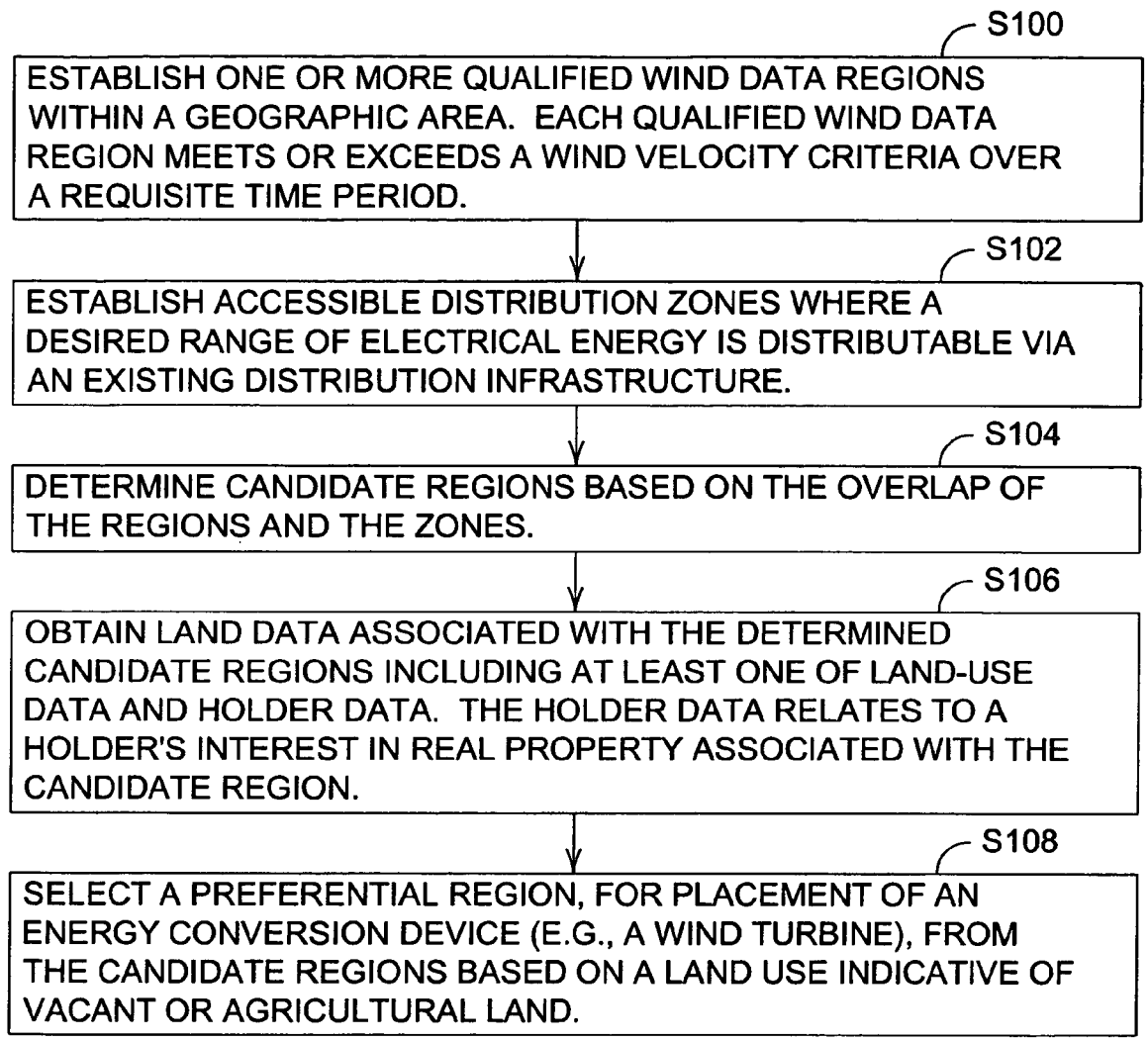
FIG. 2 is a flow chart of a method for determining a preferential region or location for a wind-powered electrical generation facility.

FIG. 2 illustrates a method for determining a preferential location or region for locating a wind-powered generation facility. The method of FIG. 2 starts in step S100.

In step S100, a wind data module 22 filters wind data to establish one or more qualified wind data regions within a defined geographic area. The defined geographic area may be defined by a user to include a defined geographic region within a county, state, country, canton, province, city, nation, multiple countries or otherwise. Each qualified wind data region meets or exceeds a wind data criteria (e.g., a minimum wind velocity critieria) over a requisite time period.

The wind data criteria may be established in accordance with various alternate or cumulative techniques. Under a first technique, the wind data criteria may comprise a wind speed or velocity that meets or exceeds 6 meters per second (e.g., an average of 6 m/s) in at least one direction over a certain defined time period (e.g., three months or greater). Under a second technique, the wind data criteria may comprise a wind regime that is consistent with a Wind Class 3, a Wind Class 4, a Wind Class 5 or a Wind Class 6 rating from at least any single direction at the site of interest. For wind turbines that are capable of pivoting over approximately 360 degrees to align and face into the wind for maximum propulsion of the blades of a wind turbine, only wind from a single direction is required to be compliant with a Wind Class 3 through Wind Class 6, inclusive. For wind turbines that pivot less than approximately 360 degrees, wind from more than one direction is required to be compliant with a Wind Class 3 through a Wind Class 6, inclusive.

In step S102, an accessible distribution module 24 filters transmission grid and distribution data to establish accessible distribution zones where a desired range of electrical energy is distributable or potentially distributable via an existing distribution infrastructure. The desired range of electrical energy to be distributed is commensurate with the level of electrical energy to be generated by the planned electrical energy generation facility. The distribution infrastructure represents at least one of a transmission line, a power station, a substation, a monopole, a tower, and location data associated with any of the foregoing items.

The planned electrical energy to be generated or generating capacity may be defined in terms of kilowatt-hours (kWh), megawatt-hours (MWh), kilowatt-hours per hour or megawatt-hours per hour. However, the capacity of transmission lines is typically defined in terms of kilovolts along particular corresponding routes or paths, rather than kilowatts or megawatts. The voltage handling capacity (e.g., in kilovolts) is mathematically proportional to the watt or power handling capacity of the transmission lines, but the voltage unit is generally regarded as more indicative of the configuration and technical specifications of various transmission lines. The capacity of the transmission lines is considered from an origination point (e.g., the interconnection point of the output of the wind-powered electrical power generation facility to the existing distribution infrastructure) to one or more corresponding destination points (e.g., a purchaser or consumer of electrical energy).

In general, the accessible distribution zones are located within a maximum linear distance from the existing distribution infrastructure. The zone may have boundaries defined within a maximum radial distance (e.g., 10 kilometers) from a transmission line. The accessible distribution may be based on a model in which a candidate location or candidate region is less than or equal to some maximum linear distance (e.g., 10 km) from the local power grid or a viable interconnection point (e.g., a tower location suitable for locating step-up or step-down transformers to match voltage levels appropriately in accordance with sound technical practices in the utility or power distribution industries) associated with the local power grid. The maximum linear distance is proportional to the acceptable cost per unit distance to establish a grid, balanced against the potential economic return from the wind farm (or energy conversion device) in a commercially reasonable and viable manner. The power grid information may be provided in the form of a database where the resolution shows power lines that service down to 60 kV or 14 kV, for example. The power grid data may provide information on the location of single phase (e.g., 60 or 50 Hz), dual phase, or three-phase line configurations.

In an alternate embodiment, step S102 may consider the estimated or actual historical load profile of one or more transmission lines to estimate whether there is sufficient residual capacity to handle locating a wind-based power plant or proposed wind farm within the preferential region without upgrading or adding additional transmission lines from the interconnection point. The load profile may consider network theory, for example. The collective output of other power plants and the load from various cities and industries impact whether there is sufficient residual capacity on the transmission lines from the origination point to the destination point(s). Decommissioning of nuclear power plants, upgrading power plants, or generations, and other increases and decreases in power generation capacity across a geographic region of interest may impact on the residual capacity of transmission lines from the origination point to the destination point(s).

Further, in another alternate embodiment, tower loading capacity and wind loading of the power transmission towers is considered to determine whether the towers have sufficient structural integrity to handle installation of additional power transmission lines to accommodate a planned wind farm or electrical power generation facility. The load profile analysis may be placed in the form of a grid impact study for submission to various governmental or agency regulators.

For illustrative purposes without limiting the desired range of electrical energy, in one embodiment the energy conversion device comprises at least one wind turbine such that the desired range of electrical energy is within a range from approximately 200 kilowatt-hours to approximately 20 megawatt-hours (or a range expressed in kilowatt-hours per hour or megawatt-hours per hour) to reduce the complexity or equipment requirements for a substation. Although the transmission line may have virtually any technically suitable kilovolt rating for interfacing with the electrical generation facility via an intermediate facility (e.g., interconnection equipment, step-up transformer, a step-down transformer, or matching transformer), in one example a potential interconnection point to the distribution infrastructure is associated with a transmission line having a rating of less than or equal to approximately 69 kilovolts. The complexity and cost of the intermediate facility that couples the energy conversion device(s) (e.g., wind turbine(s)) to the distribution infrastructure may be minimized or reduced by keeping the preferential site of the energy conversion device within the preferential region less than a maximum distance (e.g., ten kilometers) from the interconnection point which is associated with a transmission line with a rating between approximately 15 kilovolts and approximately 25 kilovolts.

In step S104, the candidate determination module 32 determines one or more candidate regions based on the overlap region or intersection of the qualified wind data regions and the accessible distribution zones. The candidate regions represent potential regions for locating the planned electric energy generation facility. If there are multiple candidate regions, each candidate region may be ranked for the most financially favorable or most economical combinations of wind data and accessible distribution data, where the wind data is used to estimate potential income from the power generating facility and the accessible distribution data is used to estimate the capital and sunk costs in providing the potential income for a particular corresponding geographic location. Optimization can be considered for individual projects (e.g., one or more wind turbines) and at a portfolio level (e.g., one or more clusters of wind turbines in geographically diverse locations).

In step S106, the land data manager 26 obtains land data associated with the determined candidate regions including at least one of a land use and a holder of an interest in real property associated with the candidate region. In a first example, the land data comprises land-use data indicative of vacant land, agricultural land, or a land area generally free of ground clutter; the land data may be associated with or referenced to corresponding location data (e.g., geographic coordinates). A land area that is generally free of ground clutter (or that has a suitable level of ground clutter) has an absence of trees, buildings or other man-made structures exceeding a certain size (e.g., greater than a minimum square footage, building height, or number of stories) within a certain minimum clearance radius of a potential site for locating an energy conversion device (e.g., a wind turbine). Land areas that may be generally free of ground clutter (or that have a suitable degree of ground clutter) may include, for example, open fields, cleared, un-forested land, desert regions, semi-arid grazing land, and the like.

In a second example, the land data comprises holder data associated with a holder of a real property interest in the preferential region, the holder data including at least one of a credit report, a credit analysis, financial data, and a historical annual income of the holder; the land data may be associated with or referenced to corresponding location data (e.g., geographic coordinates). In a third example, the land-use data may include geo-referenced agricultural land-use data, geo-referenced satellite images, geo-referenced aerial images of ground, governmental geological surveys, government geological surveys, publications or soil surveys of the National Cooperative Soil Survey, publications, studies or soil surveys sponsored by the United States Department of Agriculture zoning data from state and local governments, official census data, other geostatistical data, and location data (e.g., geographic coordinates) associated with any of the foregoing items.

In step S108, a selector 34 selects a preferential region, for placement of an energy conversion device (e.g., a wind turbine), from the candidate regions based on a land use indicative of vacant, agricultural land, or land that is generally free of ground clutter. In an alternative embodiment, the selector 34 may select a preferential region based on one or more of the following supplemental factors: financial data associated with the holder (e.g., owner or tenant or lessee) of a real property interest in the preferential region, estimated population growth and estimated future power demand in a region; availability of tax breaks, tax write-offs, or governmental subsidies for power generation within a preferential region; presence and proximity of service technicians for servicing, operating, and/or maintaining the wind farm or power generation equipment to the preferential region; and the presence and proximity of dealers or distributors distributing the wind or power generation equipment to the preferential region.

Figure 3:
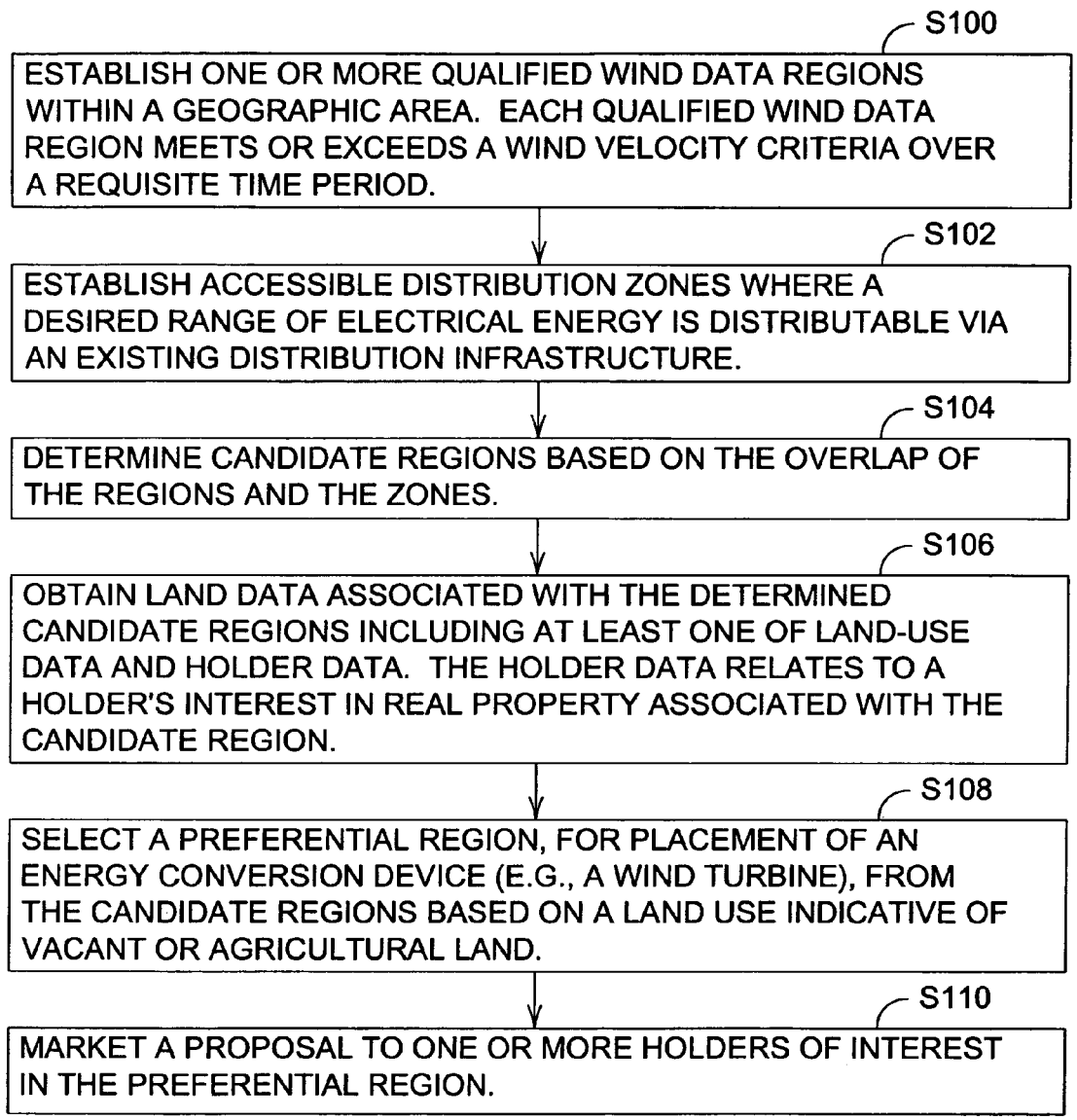
FIG. 3 is a flow chart of a method for marketing an investment in a wind-powered electrical generation facility.

The method of FIG. 3 is similar to the method of FIG. 2, except the method of FIG. 3 further includes step S110 after step S108. Like numbers in FIG. 2 and FIG. 3 indicate like steps or procedures.

In step S110, a proposal is related to the energy conversion device marketed to one or more holders of a real property interest in the preferential region. Step S110 may be executed in accordance with various alternative or cumulative techniques. In accordance with a first technique, the holders (e.g., owners) of the real property in the preferential region have financial characteristics or a financial background that satisfies a screening test. For example, the financial screening test may require the holder to meet one or more of the following financial criteria: (a) meets or exceeds minimum annual income, (b) meets or exceeds a minimum number of years in business, (c) operates a profitable small business, (d) manages a farming or agricultural operation, (e) engages in historical purchases that meet or exceed a minimal level, (f) possesses a current or historical credit rating meeting or exceeding a minimum credit rating level, (g) meets or exceeds a minimum number of years of profit or positive cash flow in a small business, farming, or agricultural operation, and (h) has a certain degree of specialized training, certification or educational qualifications.

Under a second technique, the holders of real property may be filtered to provide a list of holders that is consistent with a demographic constraint (e.g., a zip code or local indicating a minimum average income), a marketing list of previous customers of the marketer or user of the data processing system, or other geostatistical, financial, demographic, marketing or sales data. For example, the holders of real property may be filtered based on customer financial data, historical customer purchases, census data, and the like to identify suitable prospects or candidates for marketing an investment or business proposal associated with electrical power generation in the preferential region.

Figure 4:
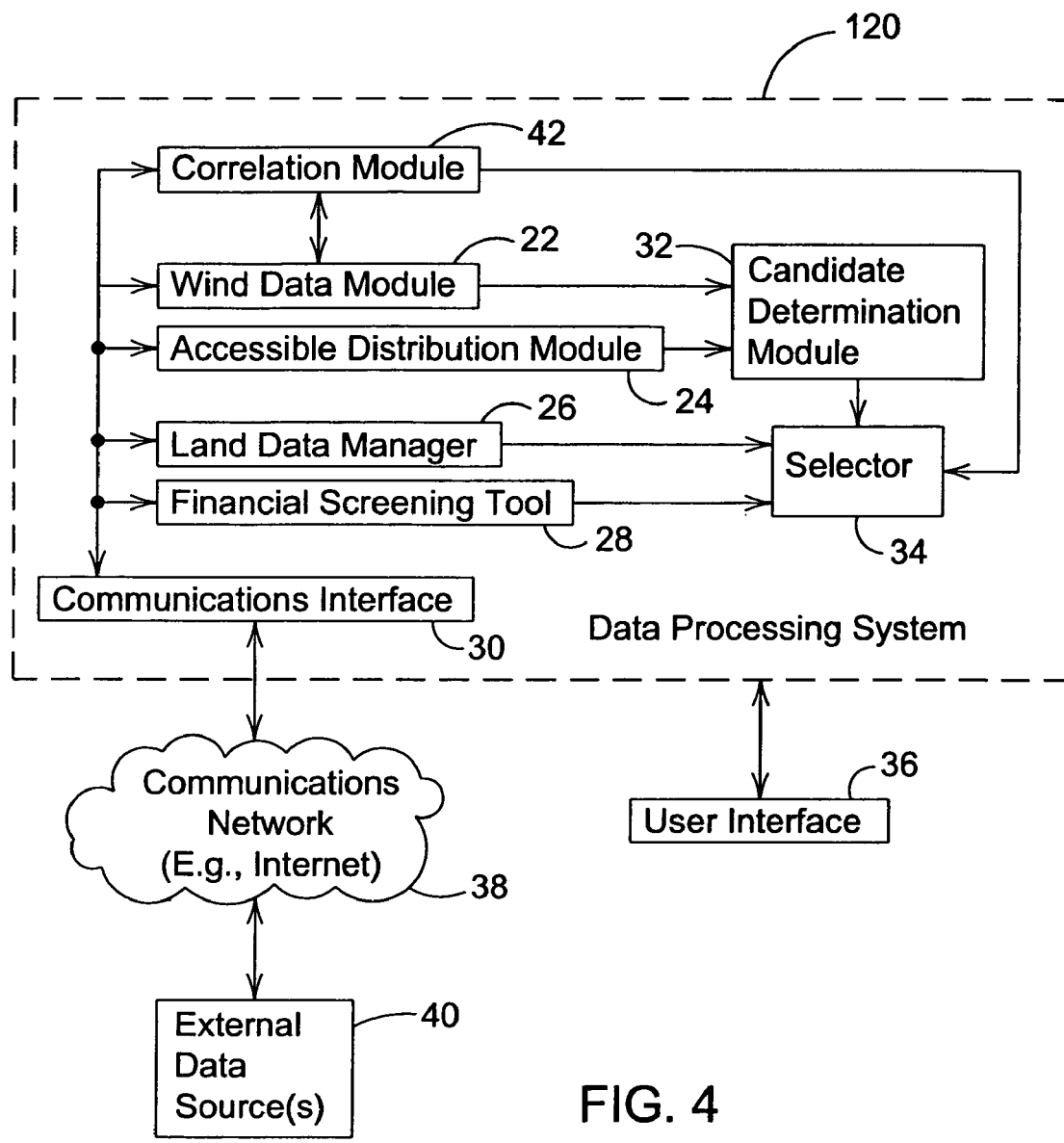
FIG. 4 is a block diagram of an alternate embodiment of a system for establishing a wind-powered electrical generation facility.

FIG. 4 illustrates an alternate data processing system 120. The data processing system 120 of FIG. 4 is similar to the data processing system 20 of FIG. 1, except the data processing system 120 further includes a correlation module 42. Like reference numbers in FIG. 1 and FIG. 4 indicate like elements.

Wind data is inputted into the correlation module 42 for different geographic coordinates or locations. The correlation module 42 determines the extent of correlation between the wind data (e.g., wind velocity, wind speed, average wind velocity and average wind speed) at two distinct locations. The correlation module 42 can be used to identify two or more locations where historical wind data (e.g., wind velocity data) demonstrates a minimal level or lack of correlation. For example, when the wind velocity peaks at site A, it tends to be at a minimum at site B, and vice versa. Accordingly, the selection of relatively uncorrelated sites A and B would support spatially diverse generation of power with improved reliability and consistency of power generation. The correlation module 42 may provide input to the selector 34 such that the selector 34 can select an array of sites distributed over a defined geographic area that produce a desired level of reliability in the aggregate (e.g., 75% reliability for generation of over megawatt-hour over a year).

Figure 5:
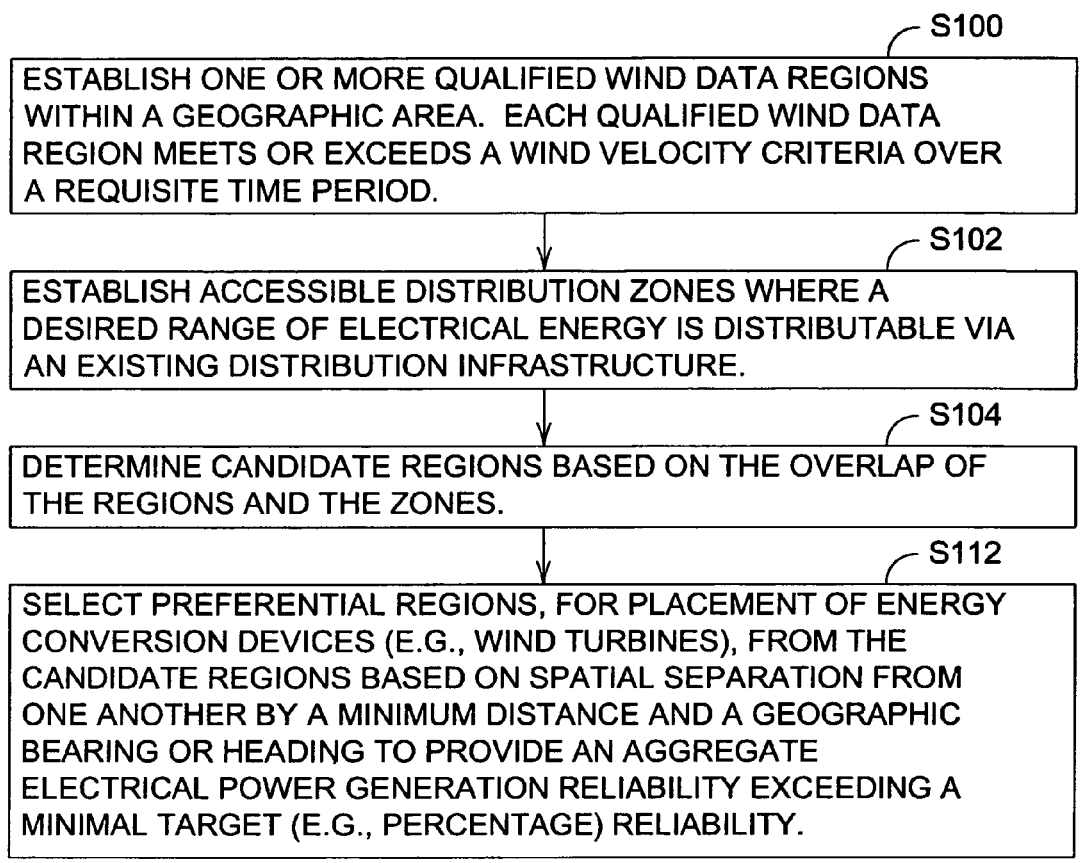
FIG. 5 is a flow chart of one embodiment of a method for establishing multiple, spatially diverse wind-powered electrical generation facilities.

The method of FIG. 5 is similar to the method of FIG. 2, except the method of FIG. 5 deletes step S106 and replaces step S108 with step S112. Like numbers in FIG. 2 and FIG. 5 indicate like steps or procedures.

In step S112, the selector 34 selects multiple preferential regions, for placement of respective energy conversion devices (e.g., wind turbines), from the candidate regions based on spatial separation from one another by a minimum distance and an angular bearing from a reference bearing. The distance and angular bearing and heading may be established by reference to at least one of a meteorological model, historical weather patterns, historical atmospheric pressure patterns, historical low pressure cell dimensions, historical high pressure cell dimensions, and historical jet stream patterns.

Step S112 may be executed in accordance with one or more of the following techniques, which may be applied alternately or cumulatively. Under a first technique, the selector 34 selects multiple preferential regions for the placement of N energy conversion devices (e.g., wind turbines) distributed in at least M clusters to provide a uniform and reliable wind power input to a national power grid of a nation or country, where N and M are positive whole numbers and N is equal to or greater than M. Each cluster is separated by a minimum distance (e.g., 300 miles) that depends upon the historical geographic scope of at least one of high pressure masses and low pressure masses within the region of interest.

Under a second technique, the multiple preferential regions are selected to provide an electrical power generation reliability exceeding a minimal percentage of reliability at a corresponding minimum energy or power generation rate.

Under a third technique, multiple preferential regions are selected from a first region westward from a mountain range, a second region eastward from a mountain range, and a third region disposed northward or southward from the mountain range to provide an aggregate electrical power minimum energy or power generation rate from the group of regions collectively with a desired level of reliability. For instance, the mountain range may be the Rocky Mountains, the third region may comprise at least a portion of Texas, the second region may be located in at least a portion of one or more of the following states: Iowa, Illinois, North Dakota, Minnesota, and South Dakota. The wind turbines in the first region, the second region, and the third region may have a common power purchase agreement with a third party.

Under a fourth technique for executing step S112, land data associated with the candidate region is obtained. The land data includes at least one of a land-use or holder data. The holder data relates to the characteristics of a holder of an interest in real property associated with the candidate region. The selection of preferential regions from the candidate regions is based on a land-use data indicative of vacant or agricultural land and the spatial separation from one another by a minimum distance. In effect, the fourth technique incorporates step S106 of FIG. 2 into step S112 of FIG. 5.

Figure 6:
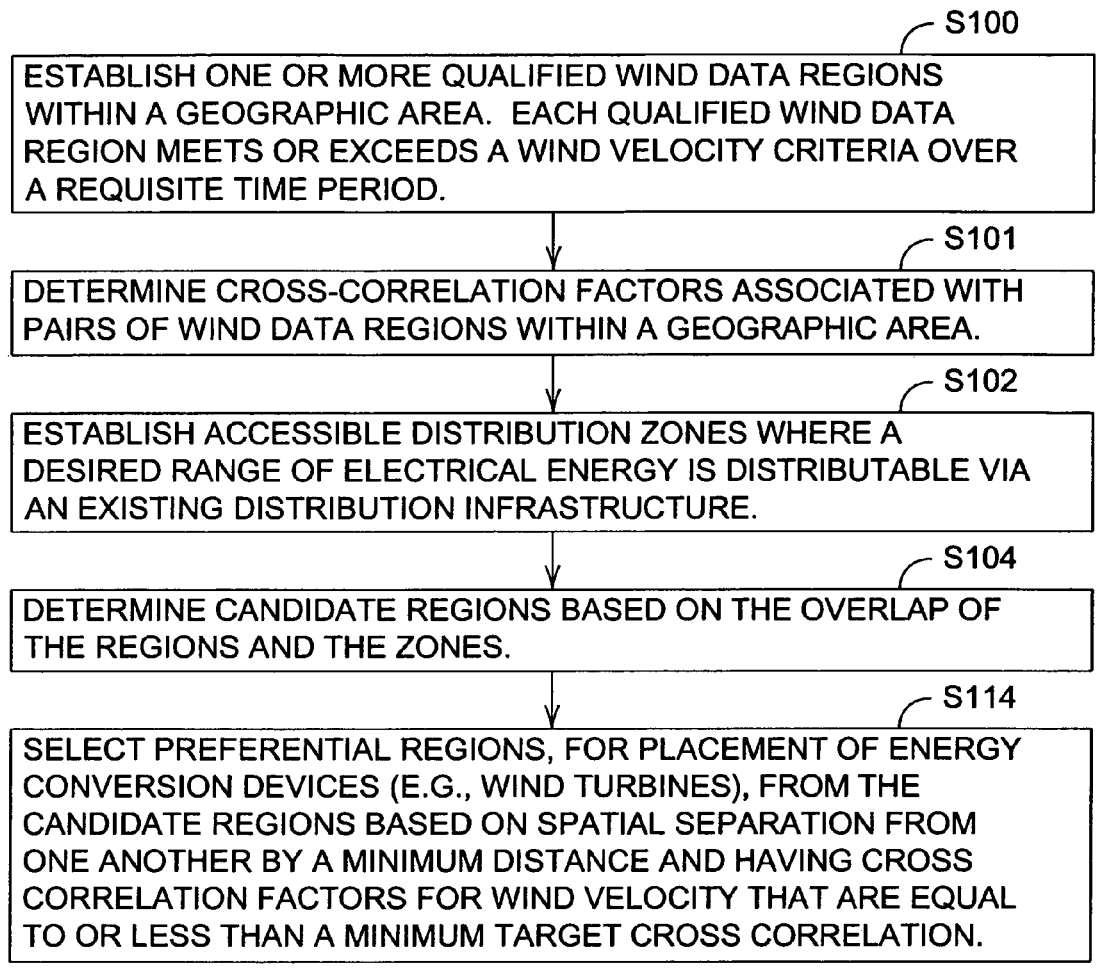
FIG. 6 is a flow chart of another embodiment of a method for establishing multiple, spatially diverse wind-powered electrical generation facilities.

The method of FIG. 6 is similar to the method of FIG. 2, except the method of FIG. 6 deletes step S106, adds step S101, and replaces step S108 with step S114.

Step S101 may be executed prior to, simultaneously with, or after step S100. In step S101, a correlation module 42 determines cross-correlation factors associated with pairs of wind data regions within a geographic area. The correlation module 42 facilitates identification of wind data regions where the wind velocity (e.g., average wind speed and average wind velocity) or wind regime lacks correlation or has a minimal correlation. For example, if correlation is measured on a scale of 0 to 1 with 0 indicating no correlation and 1 indicating a high correlation, then an intermediate value between 0 and 1 may serve as the minimal correlation threshold so that any correlation value less than the minimal correlation is sufficiently uncorrelated.

The wind data is defined to include any of the following: wind velocity, wind speed, average wind velocity, and average wind speed. In one example, the correlation module 42 determines the cross-correlation factors between the wind data at two distinct locations associated with the respective distinct preferential regions. In another example, the correlation module 42 determines cross-correlation factors between the wind data at two distinct locations and corresponding elevations within the respective distinct preferential regions. In another example, the correlation module 42 identifies preferential pairs of locations in the distinct preferential regions where historical wind data demonstrates a minimal level or lack of correlation, such that when the wind velocity peaks a first site of a particular preferential pair, it tends to be at a minimum at a second site of a preferential pair, and vice versa.

In step S114, the selector 34 selects preferential regions, for placement of conversion devices (e.g., wind turbines), from the candidate regions based on the preferential regions being spatially separated from one another and having cross correlation factors for wind velocity that are equal to or less than a minimum target cross correlation. Step S114 may be executed in accordance with various alternative procedures that may be applied individually or collectively.

In accordance with a first procedure for executing step S114, the selector 34 selects an array of sites distributed over the geographic area within the distinct preferential regions to produce electrical energy with a desired level of reliability in the aggregate. For example, the selector 34 selects an array of sites distributed over the geographic area with the distinct preferential regions to produce electrical energy at a rate of at least one megawatt-hour (or at least one megawatt-hour per hour) with at least seventy-five percent reliability over at least one year time period.

In accordance with a second procedure for executing step S114, the selector 34 further comprises an identification module for identifying multiple pairs of relatively uncorrelated wind data within the distinct preferential regions based on the determined cross-correlation factors. Further, wind data regions from the candidate cross-correlation factors are derived from the multiple pairs of relatively uncorrelated wind data, and location data (e.g., geographic coordinates) associated therewith.

Under a third procedure for executing step S114, land data associated with the candidate region is obtained. The land data includes at least one of a land-use or holder data. The holder data relates to the characteristics of a holder of an interest in real property associated with the candidate region. The selection of preferential regions from the candidate regions is based on a land-use data indicative of vacant or agricultural land and the cross correctional factors being equal to or less than a minimum target cross correlation. In effect, the above alternate technique incorporates step S106 of FIG. 2 into step S114 of FIG. 6.

Figure 7A:
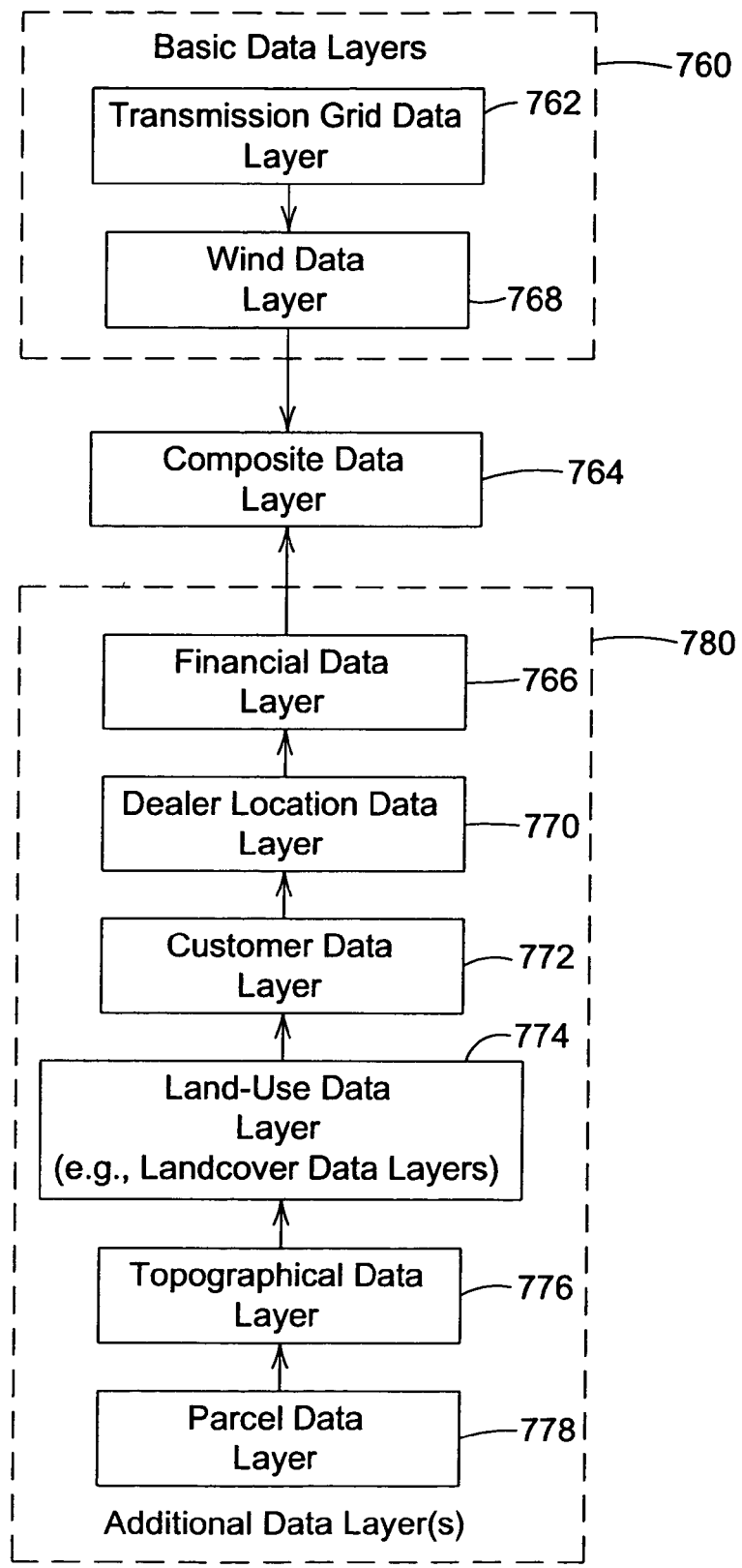
FIG. 7A is a diagram of an illustrative example of various data layers that may be combined to form a composite data layer.

FIG. 7A shows an illustrative diagram of various data layers that may be combined to form a composite data layer 764. Although other constituent data layers may contribute to the composite data layer 764, as illustrated in FIG. 7A, the composite layer comprises basic data layers 760 and one or more additional data layers 780. In one embodiment, the basic data layers 760 comprise a wind data layer 768 and a transmission grid data layer 762. The transmission grid data layer 762 may also be referred to as a distribution infrastructure data layer or the equivalent thereof.

The additional data layers 780 represent all other data layers other than the basic data layers 760. The additional data layers 780 may comprise one or more of the following data layers: parcel data layer 778, land-use data layer 774, customer data layer 772, topographical data layer 776, financial data layer 766, and dealer layer data 770 (e.g., dealer location data or dealer qualifications). The parcel data layer 778 defines the boundaries or metes and bounds of various real properties in a defined geographic area. The land-use data layer 774 defines the zoning or land use of corresponding parcels or geographic coordinates. The customer data layer 772 may comprise data gathered from customers of business, marketing lists, customer lists, historical customer purchases, credit rating, historical credit rating, customer annual income, and demographic data. The topographical data layer 776 includes data on the topographical or terrain profile of a geographic area. The financial data layer 766 may include customer financial data, data on equipment costs, maintenance costs or other financial data. The dealer data layer 770 may provide data on the service capabilities, technical competencies, certifications, qualifications, annual services sales, historical customer satisfaction, location data, and geographic coordinates for a dealer that can provide service for the conversion devices or wind turbines. The wind data layer 768 comprises wind data, as previously described herein. The composite data represents aggregate data that considers both economic and technical factors for planning the location or site of an electrical power generating facility.

Each data layer contains attribute data that is associated with corresponding location data. The data layers may be formatted in a standardized data structure for location data associated with other data of each layer. For example, the location data for each layer may be expressed as a matrix, table, or relational database of geographic coordinates.

Figure 7B:
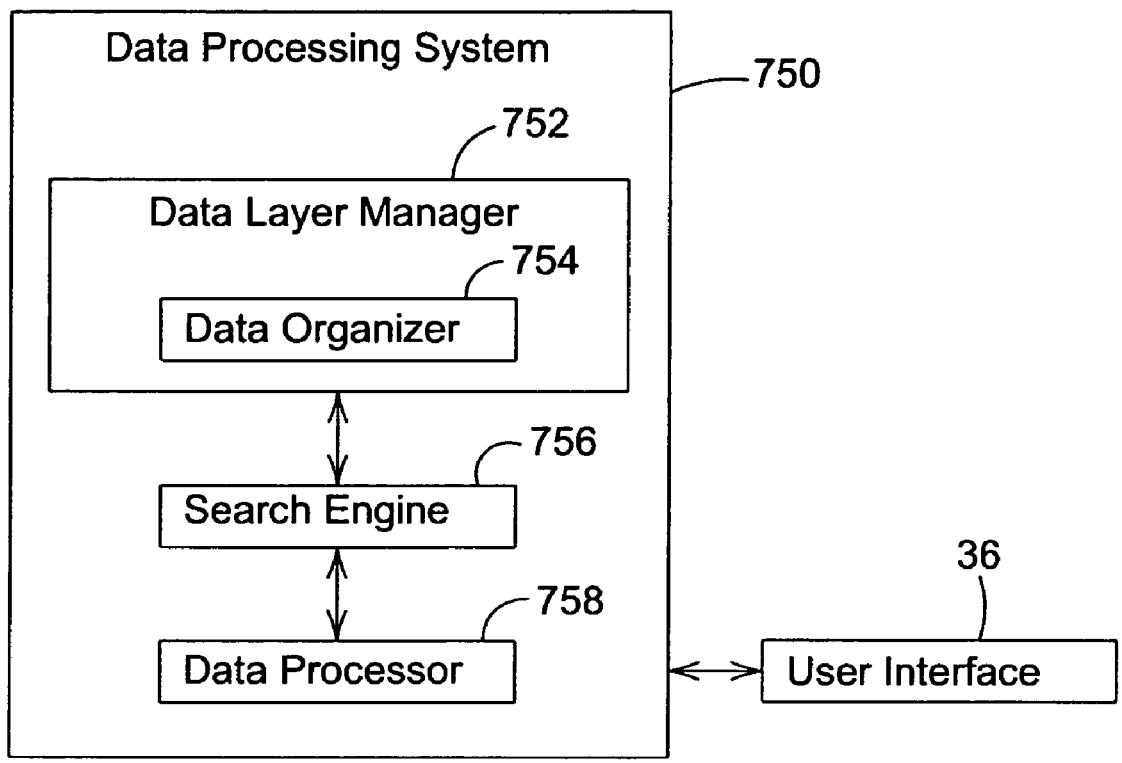
FIG. 7B is a block diagram of a system for managing multiple data layers to determine a preferential region or regions for locating an energy conversion device.

FIG. 7B shows a data processing system 750 for determining a location of a conversion device for converting wind energy into electrical energy. The data processing system 750 comprises a data layer manager 752 that communicates with a search engine 756. In turn, the search engine 756 communicates with a data processor 758. A user interface 36 supports a user interaction with the data processing system 750, such as data entry, data input, data display, and data output.

The data layer manager 752 establishes a plurality of data layers, including at least a wind data layer and a transmission grid data layer. Each data layer contains attribute data that is associated with corresponding location data. The data layer manager 752 comprises a data organizer 754 for aligning the location data of one layer with the location data of other layers to form a composite layer.

The search engine 756 is adapted to search the composite layer to identify the first compliant location data, a second compliant location data, and a third compliant location data. The first compliant location data is associated with a target value or a target value range of the attribute data for the wind data layer. The second compliant location data is associated with a target value or a target value range of the attribute data for the transmission grid data. The third compliant location data is associated with a target value or target value range of the attribute data for an additional data layer other than the wind data layer and the transmission grid data layer.

A data processor 758 determines the intersection of the first compliant location data, the second compliant location data, and the third compliant data. The data processor 758 identifies as one or more preferential regions for locating an energy conversion device based on the intersection. Accordingly, the location data and attribute data for the composite layer may be expressed as a multi-dimensional matrix with a number of dimensions equal to or greater than the total number (N) of combined constituent data layers plus one (1) matrix dimension for the common location data.

Figure 7C:
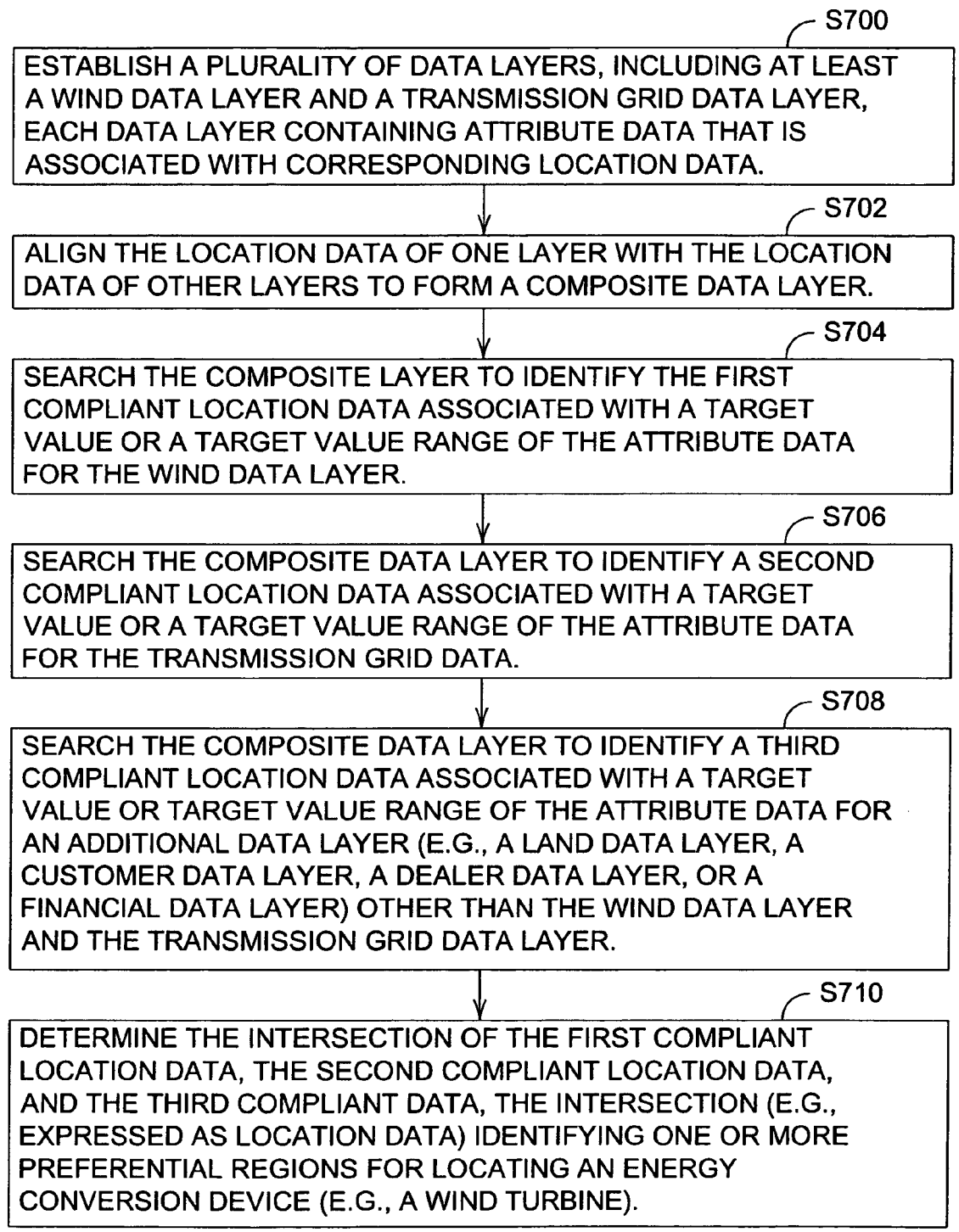
FIG. 7C is a flow chart of a method for applying multiple data layers to the selection of a preferential site or location for an energy conversion device.

FIG. 7C shows a flow chart of a method for determining a preferential site or location for locating an energy conversion device for converting wind energy into electrical energy. The method of FIG. 7C begins in step S700.

In step S700, a data layer manager 752 establishes a plurality of data layers, including at least a wind data layer and a transmission grid data layer. Each data layer contains attribute data that is associated with corresponding location data. The wind data layer comprises at least one of a wind velocity, a wind speed, a wind direction, a wind azimuth, a prevalence, a temporal component, a measurement interval, a measurement altitude or measurement height above ground level, a measurement location or measurement coordinates, a reading or sampling interval, a reliability level, a percentage of reliability, and a wind class.

The transmission grid data layer comprises one or more of the following: transmission line data, transmission line path data, transmission line capacity data, distribution infrastructure data, network data, power supply data, power plant data, power plant capacity data, power load data, power grid data, and location data or temporal periods associated with any of the foregoing items.

In an alternate embodiment, the wind data layer comprises a single dimensional or multi-dimensional matrix with following characteristics: (a) one of N angular compass directions at regularly spaced angular intervals, (b) a corresponding average wind speed for each of the N angular compass directions, where N is equal to an positive integer greater than one; (c) a time interval associated with each of the wind speeds; (d) a height of measurement or observation of the corresponding wind speed; and (e) corresponding geographic coordinates for the measurement or observation.

In step S702, a data layer manager 752 aligns the location data of one layer with the location data of other layers to form a composite layer. In a first example, the other data layer comprises a land data layer of land data, the land data comprising any of the following: metes and bounds of real property, governmental geographic survey data, land-use data, agricultural land boundaries, land owner data, land holder data of any interest in corresponding real property, satellite image data of land, aerial image data of land, public records, real property public records, grantee-grantor indices associated with various counties, census data, foreclosure notices and publicly available court filings related to real property, marketing data, demographic data, customer names and corresponding addresses, and plat data. In a second example, the other data layer comprises a financial data layer of financial data, the financial data comprising any of the following: a credit analysis of a corresponding land owner or land holder, a credit rating of a corresponding land owner or land holder, a loan application, publicly available business records, secretary of state business filings, real property mortgage records, and real property foreclosure records, census data, demographic data, annual income data, and bankruptcy filings and notices. In a third example, the other data layers comprise a data layer selected from the group consisting of a financial data layer, a land data layer, a land-use data layer, a land cover data layer, a parcel data layer, a customer data layer, a dealer data layer, and a topographical data layer. In a fourth example, a correlation data layer comprises cross correlations of wind velocity data or wind speed data associated with one or more pairs of locations within the preferential regions.

In step S704, a search engine 756 searches the composite layer to identify the first compliant location data associated with a target value or a target value range of the attribute data for the wind data layer. In one embodiment, the target value for the wind data layer comprises a wind velocity meeting or exceeding approximately 6 meters per second in at least one direction for a minimum time period.

In step S706, a search engine 756 searches the composite layer to identify a second compliant location data associated with a target value or a target value range of the attribute data for the transmission grid data. In one embodiment, the target value for the transmission grid data comprises a transmission line with a capacity of less than approximately 69 kilovolt located less than or equal to 10 kilometers from the preferential region.

In step S708, a search engine 756 searches the composite layer to identify a third compliant location data associated with a target value or target value range of the attribute data for an additional data layer other than the wind data layer and the transmission grid data layer. In one embodiment, the target value or ranges for the financial layer comprises an annual income of a potential investor or customer of at least a threshold minimum amount.

Step 708 facilitates selection of preferential area from the candidate area based on the additional data layer or additional data attribute, which may be based on one or more of the following criteria for making a business decision: user input, user discretion or user observations, empirical observations, test results, survey results, availability of data layers for a corresponding geographic area of interest, accuracy of data layers for a corresponding geographic area of interest, and past economic performance associated with various techniques of site selection.

In step S710, a data processor 758 determines the intersection of the first compliant location data, the second compliant location data, and the third compliant data. The determined intersection represents one or more preferential regions for locating an energy conversion device. The intersection means that the first compliant location data, second compliant location data, and third compliant location data are substantially spatially coincident with each other, have identical geographic coordinates, or are sufficiently proximate for one or more preferential regions to have desired characteristics for locating an energy conversion device on an economic and technical basis.

Figure 8:
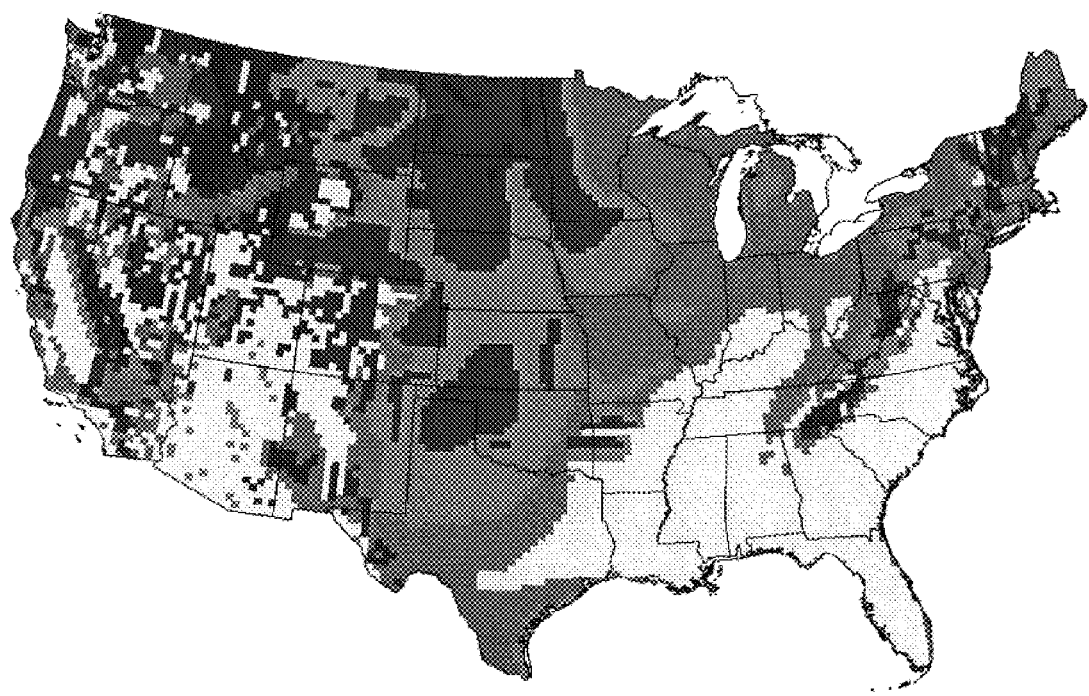
FIG. 8 is an illustrative example of a wind contour map, where each contour represents a distinct range of available wind power associated with corresponding geographic regions.

FIG. 8 is a contour map that illustrates various distinct wind power classes for corresponding location data or geographic coordinates. Each wind power class represents a range of wind velocities and respective temporal component (e.g., expressed as reliability level). As shown in FIG. 8, seven different classes of wind power are represented by corresponding contours, although any number of such wind power classes falls within the scope of the invention. The contour map of FIG. 8 provides an illustrative example of a wind data layer, although other types and configurations of wind data layers are possible and fall within the scope of the invention. It is understood that the contour map of FIG. 8 may be presented by a relational database, a look-up table or a matrix with fields representing wind power class and reference locations (e.g., geographic coordinates) of the contours.

Figure 9:
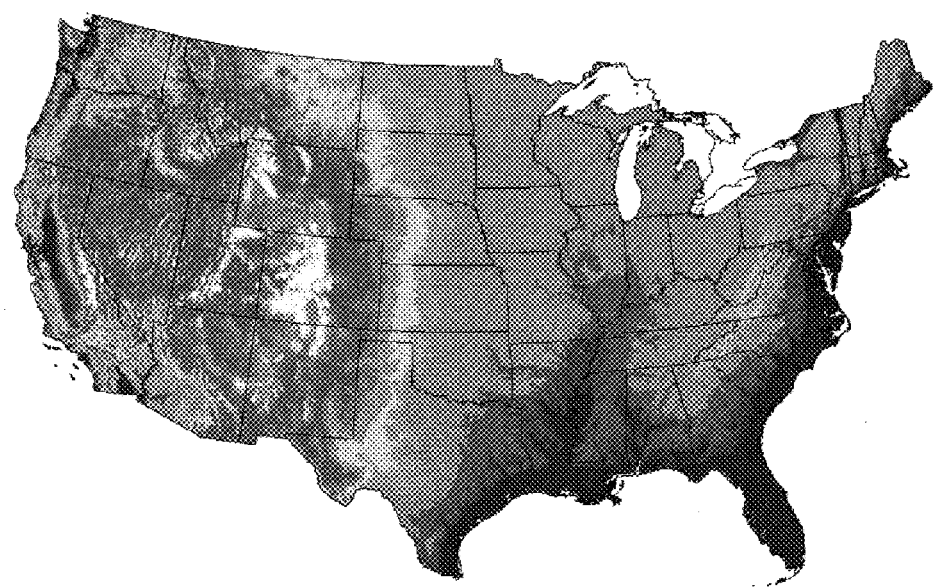
FIG. 9 is an illustrative example of topographic contour map, where each contour represents a distinct range of elevations associated with corresponding geographic regions.

FIG. 9 is a contour map that illustrates various distinct elevations or ranges of elevations for corresponding location data or geographic coordinates. Each contour represents a respective range of elevations of the terrain. As shown in FIG. 9, ten different ranges of elevations are represented, although any number of such ranges of elevations falls within the scope of the invention. For instance, a first elevation range extends approximately from 1 foot above sea level to 299 feet above sea level; a second elevation range extends approximately from 300 feet above sea level to 609 feet above sea level; a third elevation range extends approximately from 610 feet above sea level to 1219 feet above sea level; the fourth elevation range extends approximately from 1220 feet above sea level to 1829 feet above sea level; the fifth elevation range extends approximately from 1830 feet above sea level to 2439 fee above sea level; the sixth elevation range extends approximately from 2440 feet above sea level to 3049 feet above sea level; the seventh elevation range extends approximately from 3050 feet above sea level to 3659 feet above sea level, the eighth elevation range extends approximately from 3660 feet above sea level to 4269; the ninth elevation range extends approximately from 4270 feet above sea level to 5489 feet above sea level; and the tenth elevation range represents an elevation greater than or equal to approximately 5490 feet above sea level.

The contour map of FIG. 9 provides an illustrative example of a topographical data layer, although other types and configurations of topographical layers are possible and fall within the scope of the invention. For example, other topographical layers may include data on surface roughness, slope, or the rate of change in elevations. It is understood that the contour map of FIG. 9 may be presented by a relational database, a look-up table or a matrix with fields representing elevations or elevation ranges and reference locations (e.g., geographic coordinates) of the contours.

Figure 10:
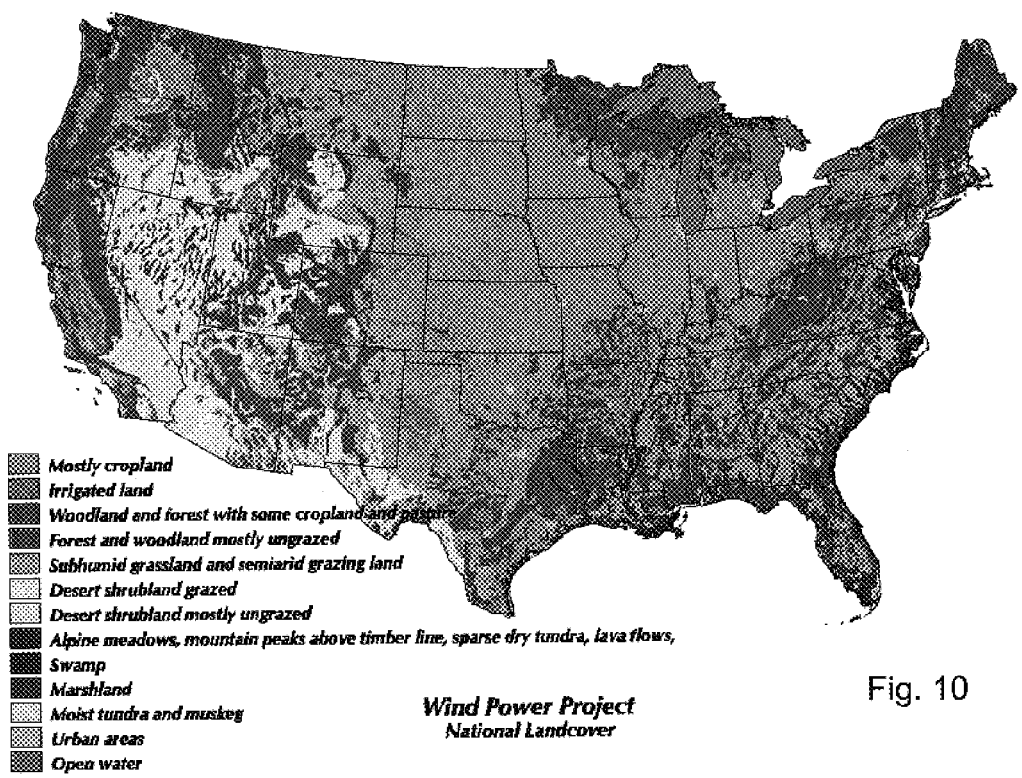
FIG. 10 is an illustrative example of a land use map, where each contour represents a distinct set of land uses or attributes associated with corresponding geographic regions.

FIG. 10 is a contour map that illustrates land cover for corresponding location data or geographic coordinates. Each land cover class represents a different ground characteristic. As shown in FIG. 10, thirteen different classes of land cover are represented, although any number of such land cover types fall within the scope of the invention. For example, the land cover classifications may include one or more of the following: (1) mostly cropland, (2) irrigated land, woodland and forest with some cropland, (3) forest and woodland mostly ungrazed, (4) sub-humid grassland and semiarid grazing land, (5) desert shrub land grazed, (6) desert shrub land mostly ungrazed, (7) alpine meadows, mountain peaks above timer, sparse dry tundra, and lava flows, (8) swamp, (9) marshland, (10) moist tundra and muskeg, (11) urban area, and (12) open water.

The contour map of FIG. 10 provides an illustrative example of a land cover data layer, although other types and configurations of land cover layers are possible and fall within the scope of the invention. It is understood that the contour map of FIG. 10 may be presented by a relational database, a look-up table or a matrix with fields representing land cover classification and reference locations (e.g., geographic coordinates) of the contours.

Figure 11:
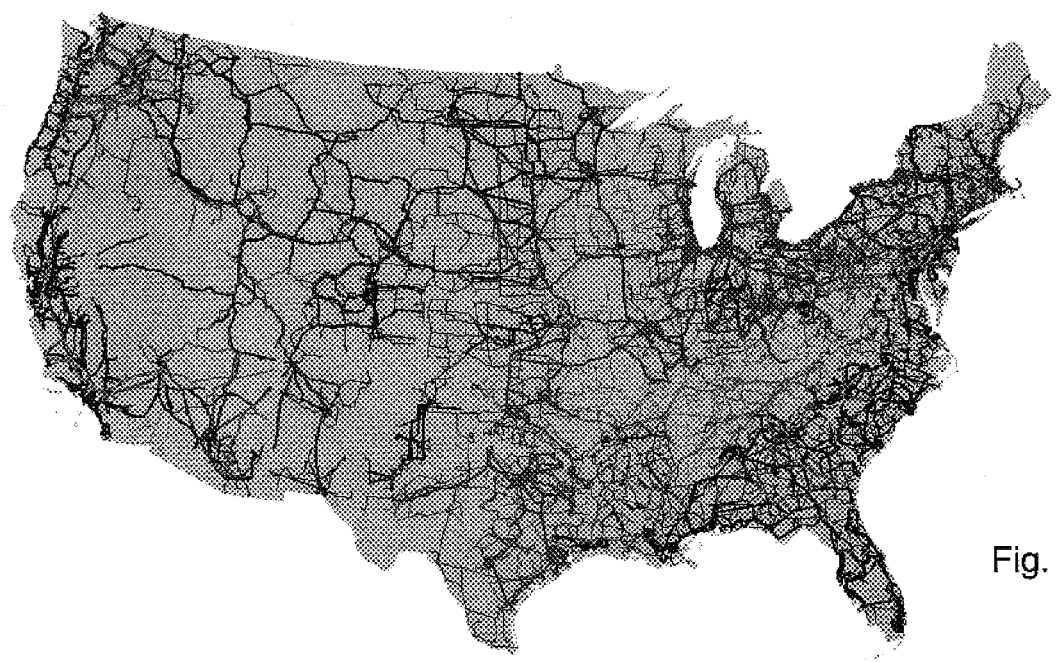
FIG. 11 is an illustrative example of an electrical transmission grid, where the paths represent the paths of various components of an electrical distribution system within a geographic region.

FIG. 11 is a contour map that illustrates various distinct power transmission paths and corresponding location data or geographic coordinates. Further, each transmission path or portion thereof is associated with a capacity range measured in kilo-volts (kV). As shown in FIG. 11, seven different ranges of transmission capacity are represented, although any number of such ranges falls within the scope of the invention. For example, a first transmission path capacity is less than 115 Kv; a second transmission path capacity extends approximately from 115 Kv to 137 Kv; a third transmission path capacity extends approximately from 138 Kv to 160 Kv; a fourth transmission path capacity extends approximately from 161 Kv to 229 Kv; a fifth transmission path capacity extends approximately from 230 Kv to 344 Kv; a sixth transmission path capacity extends approximately from 345 Kv to 499 Kv, and a seventh transmission path capacity is greater than 500 Kv.

The contour map of FIG. 11 provides an illustrative example of a transmission grid data layer, although other types and configurations of transmission grid layers are possible and fall within the scope of the invention. It is understood that the contour map of FIG. 11 may be presented by a relational database, a look-up table or a matrix with fields representing transmission power grid paths and reference locations (e.g., geographic coordinates) of the contours.

Figure 12:
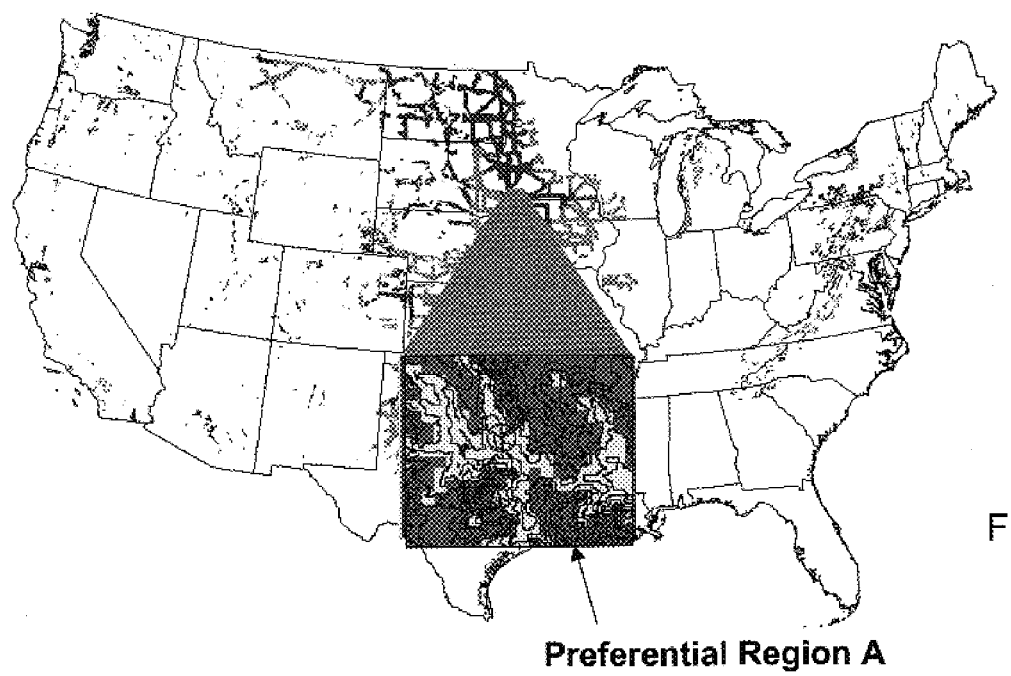
FIG. 12 represents an aggregation or overlay of a wind contour map, a topographic contour map, a land use map, and an electrical transmission grid to facilitate identification of a candidate region for locating a wind farm.

The aggregate layer or overlay layer of FIG. 12 represents the combination of the wind data layer of FIG. 8, the elevation data layer of FIG. 9, the land cover data layer of FIG. 10, and the transmission grid layer of FIG. 11. Each of the foregoing layers are geographically aligned or registered such that preferential location data or preferential geographic coordinates may be established for regions in which (a) the wind data layer meets or exceeds a wind data criteria (e.g., falling within a Wind Power Class 3 to a Wind Power Class 7, inclusive); (b) the land cover data is compliant with a desired land use or land cover criteria (e.g., representing agricultural land, vacant land, and land that is a certain distance from an urban area where buildings might degrade wind velocity); (c) the elevation is greater than an average elevation in the area above sea level or meets another elevation criteria; and (d) the transmission grid layer has sufficient potential capacity and geographical proximity to the preferential location. In the above example, the preferential region selected is designed Preferential Region A. It is understood that the Preferential Region depicted in any drawings or described in this document is merely an illustrative example, and that other preferential regions and locations with different characteristics, may fall within the scope of the invention.

Figure 13:
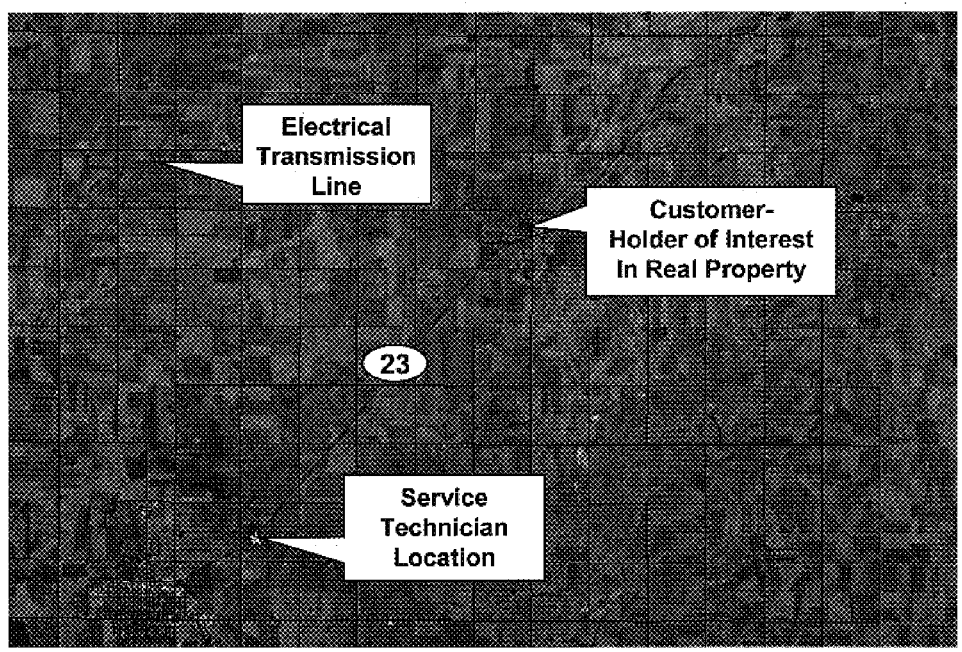
FIG. 13 is an enlargement of the candidate region of FIG. 12 that shows the proximity to the electrical transmission line and an equipment dealer/service provider.

FIG. 13 shows Preferential Region A in greater detail than FIG. 12 does. The Preferential Region A is within proximity to an electrical transmission line, a dealer or service technician for wind power or electrical generation equipment, and a potential customer which has been prequalified with respect to credit rating, credit risk, annual income or other financial attributes. The electrical transmission line has a corresponding electrical transmission line location; the service technician has a corresponding service technician location; and the potential customer-holder of interest in real property has a corresponding potential customer location. In the illustrative example, the Preferential Region A contains the electrical transmission line location, the service technician location, and the potential customer location.

Figure 14:
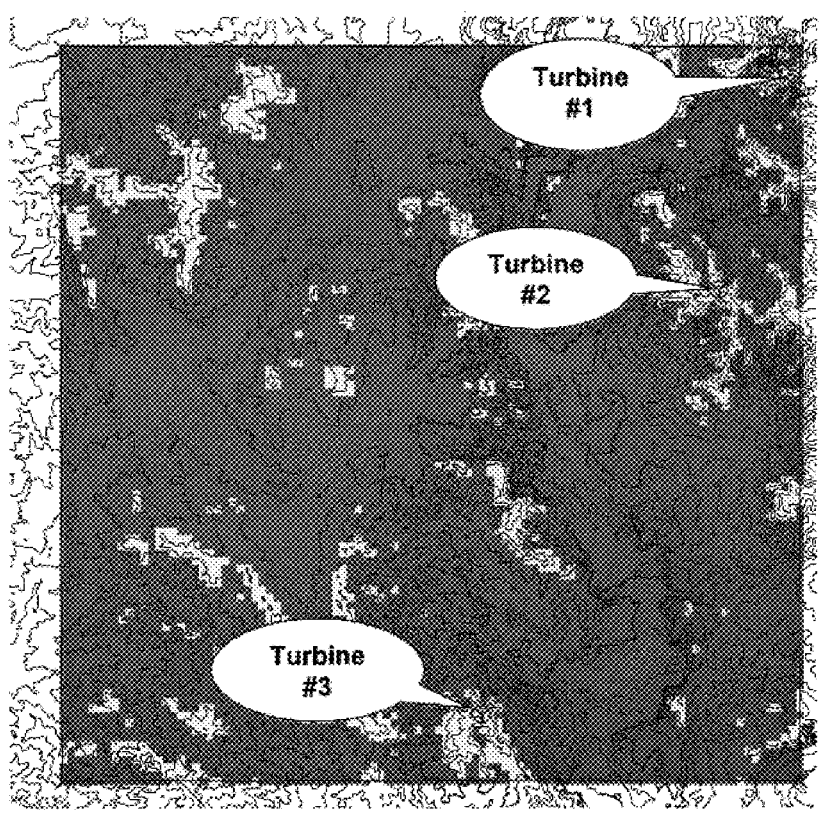
FIG. 14 represents a local site selection tool for optimizing site selection of a wind turbine within a defined, limited geographic site within the candidate region.

FIG. 14 is a detailed contour map of at least a portion of the preferential region. Each contour defines a range of ground elevations. The detailed contour map may represent a U.S. Geological survey map, a database derived therefrom, or another terrain database or topographical database with a desired degree of resolution. FIG. 14 provides local elevation data that may be used to select a reasonable or optimum location for one or more wind turbines or other components of a wind farm. In one example, the optimum location for locating a wind turbine in the preferential region may be on a plateau or the highest point on a ridge such that wind is not attenuated by the surrounding ground clutter, if any. In another example, the optimum location for locating a wind turbine in the preferential region is selected on a ridge line, a cliff or other region where the change in elevation is or approaches the greatest. In another example, the optimum location for locating a wind turbine is within a valley where wind tends to prevail, tunneled, or otherwise directed from another location through a mountain range or local topographic or terrain configuration. The detailed contour map of FIG. 14 may be used as input to a software module for selection of a preferential local site(s) for corresponding wind turbines. The software module may provide an estimate of the power generated at various alternative sites throughout the preferential region. A search engine searches through the estimates to identify the estimate that provides the greatest power generated or power generated above a certain minimum threshold, for example.

Figure 15:
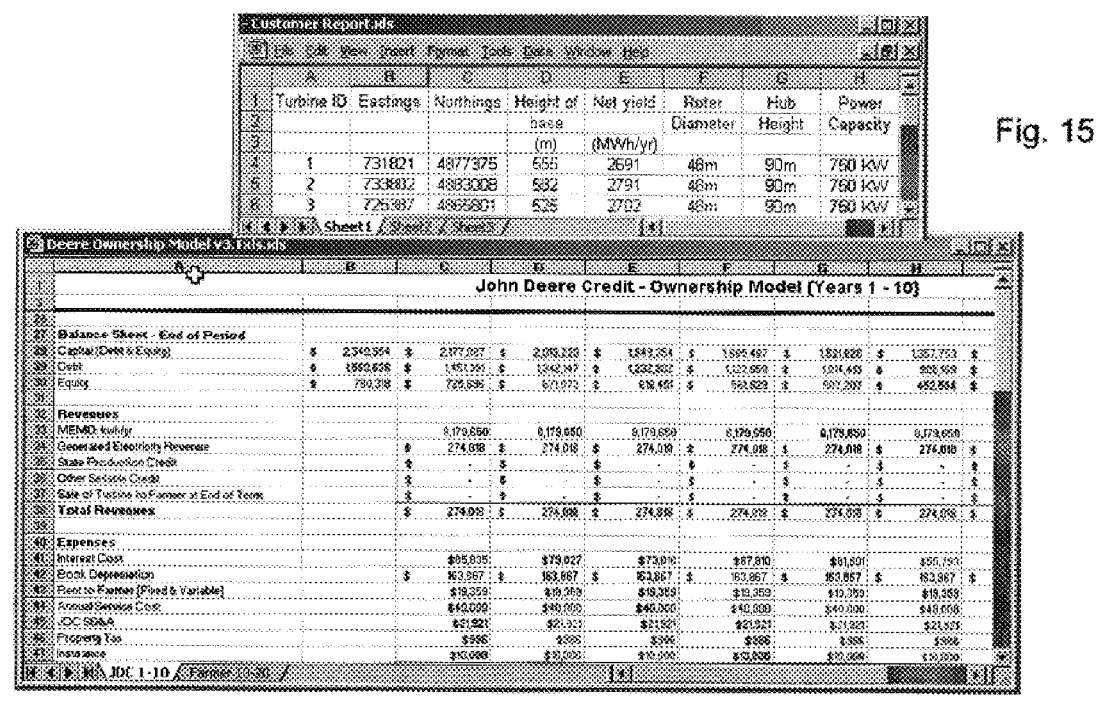

FIG. 15 illustrates a financial output associated with a corresponding design of a planned wind farm. The financial output may contain estimated balance sheets of the wind farm's performance over a prospective time period (e.g., 1 to 10 years) given the technical wind farm design. The technical wind farm design may include one or more of the following: wind turbine type, wind turbine specifications, wind turbine identifier, geographic coordinates of wind turbines, tower height of wind turbine, blade length, blade type, estimated new yield (e.g., in megawatt-hours per year (MWh/yr)), estimated cost of wind turbine, estimated cost of installation of wind farm, estimated cost of power conditioning station or sub-station, and estimated maintenance cost of the wind farm. The estimated new yield may be determined based on the local wind regime, wind turbine specifications, local power rates, tax deductions, exclusions, and accelerated depreciation benefits, and other characteristics of the wind farm design. Although the financial output of FIG. 15 is presented as a spreadsheet or chart, the financial output may be expressed in tabular, textual, or graphical form. In one embodiment, the financial output is in a suitable form for a promoter to provide to investors, investment bankers, developers, accountants, or others.

Having described the preferred embodiment, it will become apparent that various modifications can be made without departing from the scope of the invention as defined in the accompanying claims.

What is claimed is:

1. A method for determining a location of a conversion device for converting wind energy into electrical energy, the method comprising:
    establishing a plurality of data layers, including at least a wind data layer and a transmission grid data layer, each data layer containing attribute data that is associated with corresponding location data, the wind data layer based on physical measurements of wind for use within a data processing system;
    aligning the location data of one layer with the location data of other layers to form a composite layer;
    searching the composite layer to identify a first compliant location data with a target value or a target value range of the attribute data for the wind data layer;
    searching the composite layer to identify a second compliant location data with a target value or a target value range of the attribute data for the transmission grid data;
    searching the composite layer to identify a third compliant location data with a target value or target value range of the attribute data for an additional data layer other than the wind data layer and the transmission grid data layer;
    determining an intersection of the first compliant location data, the second compliant location data, and third compliant location data, and identifying the intersection as one or more preferential regions for locating an energy conversion device, where the one or more preferential regions are expressed to user as a contour map.

2. The method according to claim 1 wherein the wind data layer comprises at least one of a wind velocity, a wind speed, a wind direction, a wind azimuth, a prevalence, a temporal component, a measurement interval, a measurement altitude or measurement height above ground level, a measurement location or measurement coordinates, a reading or sampling interval, a reliability level, a percentage of reliability, and a wind class.

3. The method according to claim 1 wherein the transmission grid data layer comprises one or more of the following: transmission line data, transmission line path data, transmission line capacity data, distribution infrastructure data, network data, power supply data, power plant data, power plant capacity data, power load data, power grid data, and location data or temporal periods associated with any of the foregoing items.

4. The method according to claim 1 wherein the additional data layer comprises a land data layer of land data, the land data comprising any of the following: metes and bounds of real property, governmental geographic survey data, land-use data, agricultural land boundaries, land owner data, land holder data of any interest in corresponding real property, satellite image data of land, aerial image data Of land, public records, real property public records, grantee-grantor indices associated with various counties, census data, foreclosure notices and publicly available court filings related to real property, marketing data, demographic data, customer names and corresponding addresses, and plat data.

5. The method according to claim 1 wherein the additional data layer comprises a financial data layer of financial data, the financial data, comprising any of the following: a credit analysis of a corresponding land owner or land holder, a credit rating of a corresponding land owner or land holder, a loan application, publicly available business records, secretary of state business filings, real property mortgage records, and real property foreclosure records, census data, demographic data, annual income data, and bankruptcy filings and notices.

6. The method according to claim 1 wherein the additional data layer comprises a data layer selected from the group consisting of a financial data layer, a land data layer, a land-use data layer, a customer data layer, a dealer data layer, and a topographical data layer.

7. The method according to claim 1 wherein the target value for the wind data layer comprises a wind velocity meeting or exceeding about 6 meters per second in at least one direction for a minimum time period.

8. The method according to claim 1 wherein the target value for the transmission grid data comprises a transmission line with a capacity of less than about 69 kilovolts located less than or equal to 10 kilometers from the preferential region.

9. The method according to claim 5 wherein the target value or the target value range for the financial layer comprises an annual income of a potential investor or customer of at least a threshold minimum amount.

10. The method according to claim 1 wherein the wind data layer comprises a single dimensional or multi-dimensional matrix with following characteristics: (a) one of N angular compass directions at regularly spaced angular intervals; (b) a corresponding average wind speed for each of the N angular compass directions, where N is equal to an positive integer greater than one; (c) a time interval associated with each of the wind speeds; (d) a height of measurement or observation of the corresponding wind speed; and (e) corresponding geographic coordinates for the measurement or observation.

11. The method according to claim 1 wherein a correlation data layer comprises cross correlations of wind velocity data or wind speed data associated with one or more pairs of locations within the preferential regions.

12. A system for determining a location of a conversion device for converting wind energy into electrical energy, the system comprising:
a data layer manager for establishing a plurality of data layers, including at least a wind data layer and a transmission grid data layer, each data layer containing attribute data that is with corresponding location data; the data layer manager comprising a data organizer for aligning the location data of one layer with the location data of other layers to form a composite layer, the wind data layer based on physical measurements of wind for use within a data processing system;
a search engine for searching the composite layer to identify first compliant location data, second compliant location data, and third compliant location data, the first compliant location data with a target value or a target value range of the attribute data for the wind data layer; the second compliant location data with a target value or a target value range of the attribute data for the transmission grid data; the third compliant location data with a target value or target value range of the attribute data for an additional data layer other than the wind data layer and the transmission grid data layer; and
a data processor for determining an intersection of the first compliant location data, the second compliant location data, and third compliant location data, and identifying the intersection as one or more preferential regions for locating an energy conversion device, where the one or more preferential regions are expressed to a user as a contour map.

13. The system according to claim 12 wherein the wind data layer comprises at least one of a wind velocity, a wind speed, a wind direction, a wind azimuth, a prevalence, a temporal component, a measurement interval, a measurement altitude or measurement height above ground level, a measurement location or measurement coordinates, a reading or sampling interval, a reliability level, a percentage of reliability, and a wind class.

14. The system according to claim 12 wherein the transmission grid data layer comprises one or more of the following: transmission line data, transmission line path data, transmission line capacity data, distribution infrastructure data, network data, power supply data, power plant data, power plant capacity data, power load data, power grid data, and location data or temporal periods associated with any of the foregoing items.

15. The system according to claim 12 wherein the additional data layer comprises a land data layer of land data, the land data comprising any of the following: metes and bounds of real property, governmental geographic survey data, land-use data, agricultural land boundaries, land owner data, land holder data of any interest in corresponding real property, satellite image data of land, aerial image data of land, public records, real property public records, grantee-grantor indices associated with various counties, census data, foreclosure notices and publicly available court filings related to real property, marketing data, demographic data, customer names and corresponding addresses, and plat data.

16. The system according to claim 12 wherein the additional data layer comprises a financial data layer of financial data, the financial data comprising any of the following: a credit analysis of a corresponding land owner or land holder, a credit rating of a corresponding land owner or land holder, a loan application, publicly available business records, secretary of state business filings, real property mortgage records, real property foreclosure records, census data, demographic data, annual income data, and bankruptcy filings and notices.

17. The system according to claim 12 wherein the additional data layer comprises a data layer selected from the group consisting of a financial data layer, a land data layer, a land-use data layer, a customer data layer, a dealer data layer, and a topographical data layer.

18. The system according to claim 12 wherein the target value for the wind data layer comprises a wind velocity meeting or exceeding about 6 meters per second in at least one direction for a minimum time period.

19. The system according to claim 12 wherein the target value for the transmission grid data comprises a transmission line with a capacity of less than about 69 kilovolt located less than or equal to 10 kilometers from the preferential region.

20. The system according to claim 12 wherein the target value or the target range for the financial layer comprises an annual income of a potential investor or customer of at least a threshold minimum amount.

21. The system according to claim 12 wherein the wind data layer comprises a single dimensional or multi-dimensional matrix with following characteristics: (a) one of N angular compass directions at regularly spaced angular intervals; (b) a corresponding average wind speed for each of the N angular compass directions, where N is equal to an positive integer greater than one; (c) a time interval associated with each of the wind speeds; (d) a height of measurement or observation of the corresponding wind speed; (e) and a corresponding geographic coordinates for the measurement or observation.

22. The system according to claim 12 wherein a correlation data layer comprises cross correlations of wind velocity data or wind speed data associated with one or more pairs of locations within the preferential regions.

* * * * *